US012586762B2

(12) United States Patent　　(10) Patent No.:　US 12,586,762 B2
Yamazawa　　(45) **Date of Patent:　*Mar. 24, 2026**

(54) FILTER CIRCUIT

(71) Applicant: TOKYO ELECTRON LIMITED, Tokyo (JP)

(72) Inventor: Yohei Yamazawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 22 days.

This patent is subject to a terminal disclaimer.

(21) Appl. No.: 18/668,416

(22) Filed: May 20, 2024

(65) Prior Publication Data

US 2024/0304421 A1　Sep. 12, 2024

Related U.S. Application Data

(63) Continuation of application No. 17/520,500, filed on Nov. 5, 2021, now Pat. No. 11,990,318.

(30) Foreign Application Priority Data

| Nov. 6, 2020 | (JP) | 2020-185717 |
| Dec. 25, 2020 | (JP) | 2020-217101 |
| Jul. 14, 2021 | (JP) | 2021-116623 |

(51) Int. Cl.
　　*H01J 37/32*　　(2006.01)
(52) U.S. Cl.
　　CPC .. *H01J 37/32183* (2013.01); *H01J 37/32724* (2013.01)

(58) Field of Classification Search
None
See application file for complete search history.

(56) References Cited

U.S. PATENT DOCUMENTS

| 6,117,279 A * | 9/2000 | Smolanoff | .......... H01J 37/3405 |
| | | | 204/192.12 |
| 6,208,095 B1 | 3/2001 | Divergilio et al. | |
| 6,239,541 B1 | 5/2001 | Fujisawa | |
| 6,423,976 B1 | 7/2002 | Glavish et al. | |
| 6,485,602 B2 * | 11/2002 | Hirose | .............. H01J 37/32082 |
| | | | 257/E21.252 |
| 6,537,421 B2 * | 3/2003 | Drewery | ........... H01J 37/32706 |
| | | | 156/345.48 |

(Continued)

FOREIGN PATENT DOCUMENTS

| CN | 104752134 A | 7/2015 |
| JP | 2008-054287 A | 3/2008 |

(Continued)

*Primary Examiner* — Srinivas Sathiraju

(74) *Attorney, Agent, or Firm* — XSENSUS LLP

(57) ABSTRACT

There is provided a filter circuit provided in a plasma processing device for processing a substrate using plasma generated using power of a first frequency of 4 MHz or more and power of a second frequency of 100 Hz or more and less than 4 MHz. The filter circuit comprises: a first filter provided in a wiring between a conductive member provided in the plasma processing device and a power supply configured to supply power of a third frequency of less than 100 Hz or control power which is direct-current (DC) power, to the conductive member; and a second filter provided in a wiring between the first filter and the power supply.

10 Claims, 10 Drawing Sheets

(56) References Cited

U.S. PATENT DOCUMENTS

| | | | | |
|---|---|---|---|---|
| 9,099,503 B2* | 8/2015 | Iwata | ................ | H01J 37/32082 |
| 9,401,264 B2* | 7/2016 | Marakhtanov | .... | H01J 37/32183 |
| 9,530,619 B2* | 12/2016 | Okunishi | .......... | H01J 37/32798 |
| 9,805,919 B1* | 10/2017 | Hanks | ............... | H01J 37/32165 |
| 10,373,794 B2* | 8/2019 | Burkhart | .......... | H01J 37/32935 |
| 10,435,789 B2* | 10/2019 | Tsuji | ................. | H01J 37/32183 |
| 10,770,267 B1* | 9/2020 | Kartashyan | ....... | H01J 37/32183 |
| 11,295,937 B2* | 4/2022 | Zhao | ................. | H01L 21/02274 |
| 11,990,318 B2* | 5/2024 | Yamazawa | ........ | H01J 37/32724 |
| 2002/0007915 A1* | 1/2002 | Hirose | ............. | H01J 37/32082 |
| | | | | 257/E21.252 |
| 2003/0041972 A1* | 3/2003 | Hirose | ............. | H01J 37/32082 |
| | | | | 257/E21.252 |
| 2004/0035365 A1* | 2/2004 | Yamazawa | ............ | H01J 37/321 |
| | | | | 156/345.44 |
| 2004/0061068 A1 | 4/2004 | Farley et al. | | |
| 2004/0149221 A1* | 8/2004 | Koshimizu | ....... | H01J 37/32082 |
| | | | | 156/345.43 |
| 2004/0211518 A1* | 10/2004 | Hirose | ............. | H01J 37/32183 |
| | | | | 257/E21.252 |
| 2005/0009347 A1* | 1/2005 | Matsumoto | ....... | H01J 37/32174 |
| | | | | 257/E21.252 |
| 2006/0037704 A1* | 2/2006 | Iwata | ................ | H01J 37/32091 |
| | | | | 156/345.48 |
| 2007/0227449 A1* | 10/2007 | Yamazawa | ........ | H01J 37/32091 |
| | | | | 118/723 I |
| 2008/0197780 A1* | 8/2008 | Yamazawa | ........ | H01L 21/67069 |
| | | | | 315/111.21 |
| 2009/0101283 A1* | 4/2009 | Iwata | ................ | H01J 37/32082 |
| | | | | 156/345.28 |
| 2009/0133839 A1* | 5/2009 | Yamazawa | ........ | H01J 37/32174 |
| | | | | 156/345.48 |
| 2011/0000783 A1* | 1/2011 | Ohmi | ................. | H01J 37/3455 |
| | | | | 204/192.15 |
| 2012/0160808 A1* | 6/2012 | Kikuchi | ............. | H01L 21/6831 |
| | | | | 156/345.52 |
| 2014/0098919 A1 | 4/2014 | Kumakhov | | |
| 2014/0170859 A1* | 6/2014 | Yamawaku | ....... | H01L 21/02164 |
| | | | | 438/778 |
| 2014/0217893 A1 | 8/2014 | Chang Diaz et al. | | |
| 2015/0091441 A1* | 4/2015 | Marakhtanov | .... | H01J 37/32174 |
| | | | | 315/111.21 |
| 2015/0262793 A1* | 9/2015 | Okunishi | .......... | H01J 37/32155 |
| | | | | 156/345.24 |
| 2016/0079038 A1* | 3/2016 | Okunishi | .......... | H01J 37/32798 |
| | | | | 315/111.21 |
| 2016/0126067 A1* | 5/2016 | Okunishi | .......... | H01J 37/32724 |
| | | | | 118/723 R |
| 2016/0205759 A1 | 7/2016 | Chang Diaz et al. | | |
| 2016/0307738 A1* | 10/2016 | Marakhtanov | .... | H01J 37/32183 |
| 2016/0358755 A1* | 12/2016 | Long | ................. | H01J 37/32155 |
| 2017/0338081 A1* | 11/2017 | Yamazawa | ........ | H01J 37/32091 |
| 2018/0158709 A1* | 6/2018 | Tsuji | ................. | H01J 37/32165 |
| 2018/0350569 A1* | 12/2018 | Kaneko | ............. | H01L 21/3065 |
| 2018/0350570 A1* | 12/2018 | Endo | ................. | H01L 21/67248 |
| 2019/0051497 A1* | 2/2019 | Long | ................. | H01J 37/32577 |
| 2019/0137415 A1* | 5/2019 | Gopalan | .......... | H01J 37/32935 |
| 2019/0177848 A1* | 6/2019 | Chen | ................. | H01J 37/32715 |
| 2019/0304754 A1* | 10/2019 | Shim | ................. | H01J 37/32642 |
| 2019/0371562 A1 | 12/2019 | Sinclair | | |
| 2020/0126765 A1* | 4/2020 | Ulrich | ............... | H01J 37/32183 |
| 2020/0243303 A1* | 7/2020 | Mishra | ............. | H01J 37/32036 |
| 2020/0343123 A1* | 10/2020 | Ye | ....................... | H01L 21/6833 |
| 2021/0057187 A1* | 2/2021 | Kim | ................. | H01L 21/67103 |
| 2021/0082667 A1* | 3/2021 | Zhao | ................. | H01L 21/31116 |
| 2021/0104386 A1* | 4/2021 | Endo | ................. | H01L 21/6833 |
| 2021/0366695 A1* | 11/2021 | Galstyan | ............ | H01L 21/6831 |
| 2022/0148854 A1* | 5/2022 | Yamazawa | ........ | H01J 37/32724 |
| 2022/0399193 A1* | 12/2022 | Cui | ................... | H01J 37/32146 |
| 2022/0406565 A1* | 12/2022 | Chen | ................. | H01J 37/32183 |
| 2023/0197411 A1* | 6/2023 | Kim | ................. | H01J 37/32183 |
| | | | | 438/798 |
| 2023/0207267 A1* | 6/2023 | Valcore, Jr. | ....... | H01J 37/32183 |
| | | | | 315/111.21 |
| 2023/0207285 A1* | 6/2023 | Koshimizu | ....... | H01J 37/32091 |
| | | | | 156/345.48 |
| 2024/0154594 A1* | 5/2024 | Yamazawa | ............ | C23C 16/505 |
| 2024/0304421 A1* | 9/2024 | Yamazawa | ........ | H01J 37/32183 |
| 2024/0347317 A1* | 10/2024 | Wang | ............... | H01J 37/32146 |

FOREIGN PATENT DOCUMENTS

| | | | |
|---|---|---|---|
| JP | 2014-056706 A | 3/2014 |
| JP | 2014-229565 A | 12/2014 |
| KR | 10-2015-0054767 A | 5/2015 |
| TW | I590290 B | 7/2017 |

* cited by examiner

FILTER CIRCUIT

CROSS-REFERENCE TO RELATED APPLICATIONS

This application is a continuation of U.S. application Ser. No. 17/520,500, filed Nov. 5, 2021, which claims priority to Japanese Patent Application Nos. 2020-185717 filed on Nov. 6, 2020, 2020-217101 filed on Dec. 25, 2020, and 2021-116623 filed on Jul. 14, 2021, respectively, the entire contents of each are incorporated herein by reference.

TECHNICAL FIELD

The present disclosure relates to a filter circuit.

BACKGROUND

For example, Japanese Patent Application Publication No. 2014-229565 discloses a plasma processing device including a first power supply 28, a second power supply 30, a heating wire 40, a heater power supply 58, and a filter 54. A first filter 84A of the filter 54 includes a primary stage having an air-core coil AL1 and a capacitor AC1 and a secondary stage having a toroidal coil AL2 and a capacitor AC2.

SUMMARY

The present disclosure is directed to providing a filter circuit capable of suppressing power, which is supplied to plasma, leaking to a power supply and suppressing power loss of plasma.

In accordance with an aspect of the present disclosure, there is provided a filter circuit provided in a plasma processing device for processing a substrate using plasma generated using power of a first frequency of 4 MHz or more and power of a second frequency of 100 Hz or more and less than 4 MHz. The filter circuit comprises: a first filter provided in a wiring between a conductive member provided in the plasma processing device and a power supply configured to supply power of a third frequency of less than 100 Hz or control power which is direct-current (DC) power, to the conductive member; and a second filter provided in a wiring between the first filter and the power supply. The first filter includes: a first coil which is connected to the wiring in series and which has no core material or has a first core material with a relative permeability of less than 10; and a series resonant circuit which is connected between the wiring and a ground and which has a coil and a capacitor which are connected in series. The second filter includes a second coil which is connected to the wiring provided between the first coil and the power supply in series and which has a second core material with a relative permeability of 10 or more.

DETAILED DESCRIPTION

Hereinafter, embodiments of the present disclosure will be described in detail with reference to the accompanying drawings. In addition, the filter circuit is not limited by embodiments below.

Meanwhile, a conductive member such as a heater for controlling a temperature of the substrate is installed in a device for processing a substrate using plasma. In order to suppress radio frequency (RF) power used for plasma generation from being fed back to a power supply including a heater control circuit via the conductive member, a filter circuit is provided in a wiring between the conductive member and the power supply. In addition, when power of a first frequency and power of a second frequency are supplied to the plasma, it is necessary for the filter circuit to suppress both the power of the first frequency and the power of the second frequency from being fed back to the power supply including the heater control circuit via the conductive member.

However, when impedance of the filter circuit is low at the first frequency and the second frequency, the power of the first frequency and the power of the second frequency, which are supplied to the plasma, are decreased, and power loss of the plasma occurs.

Therefore, the present disclosure is directed to providing a technology capable of suppressing power, which is supplied to plasma, leaking to a power supply and suppressing power loss of plasma.

[Configuration of Plasma Processing Device 1]

Figure 1:
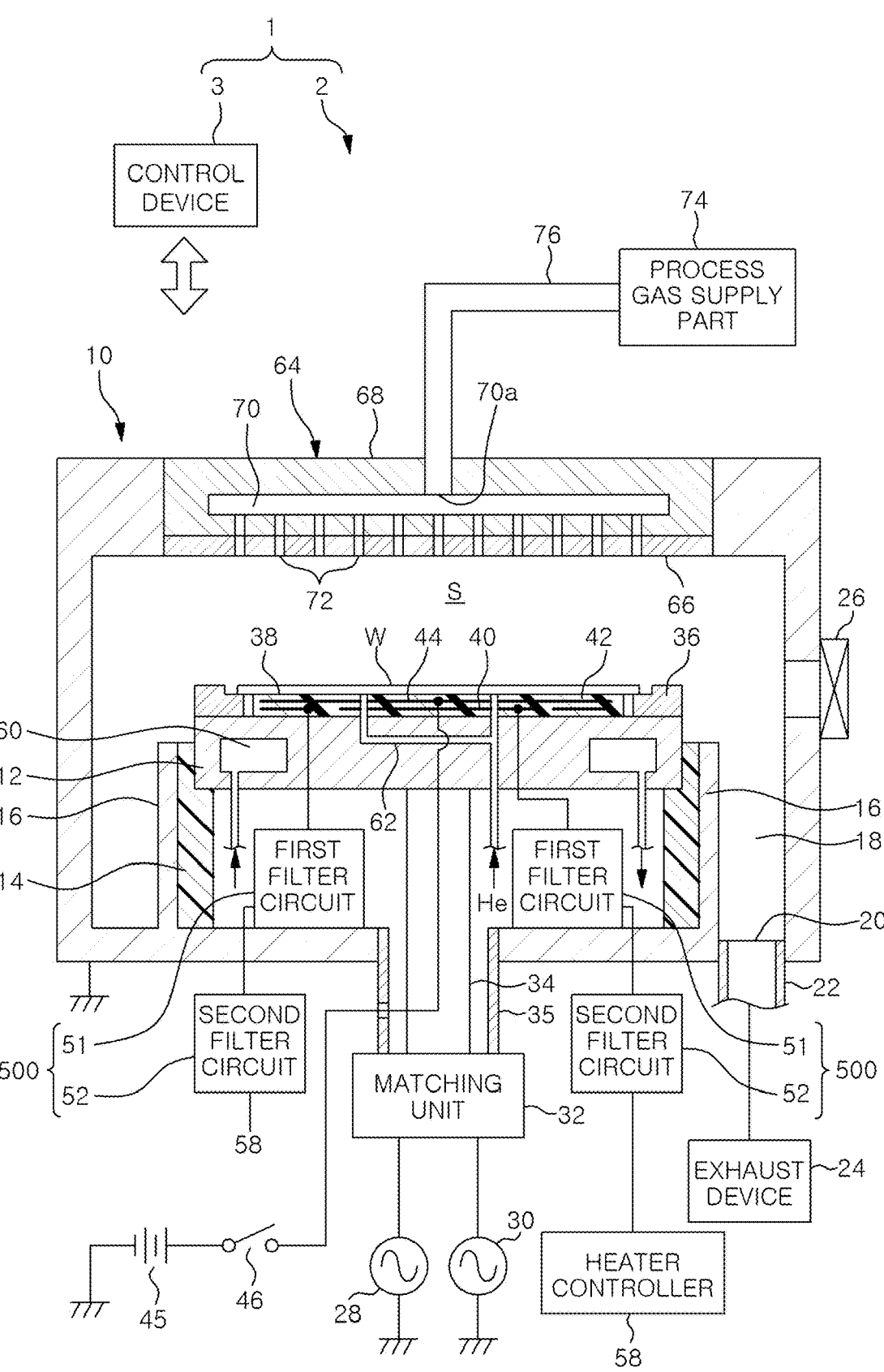
FIG. 1 is a schematic cross-sectional view illustrating an example of a plasma processing device according to one embodiment of the present disclosure.

FIG. 1 is a schematic cross-sectional view illustrating an example of a plasma processing device 1 according to one embodiment of the present disclosure. In the present embodiment, the plasma processing device 1 is a device for processing a substrate W using capacitively coupled plasma. The plasma processing device 1 includes a device main body 2 and a control device 3.

The device main body 2 includes a substantially cylindrical shaped chamber 10 formed of, for example, aluminum or stainless steel. The chamber 10 is securely grounded. A substantially disc-shaped base 12 is disposed in the chamber 10. The base 12 is formed of, for example, aluminum and serves as a lower electrode. The base 12 is supported on a cylindrical-shaped support 14 extending vertically upward from a bottom of the chamber 10. The support 14 is formed of an insulating member such as ceramic. Therefore, the support 14 is electrically insulated from the chamber 10.

A cylindrical-shaped conductive support 16 extending vertically upward from the bottom of the chamber 10 along an outer circumference of the support 14 is provided on the outer circumference thereof. An annular exhaust path 18 is formed between the cylindrical-shaped support 16 and an inner wall of the chamber 10. The exhaust port 20 is provided in a bottom of the exhaust path 18. An exhaust device 24 including a turbo molecular pump is connected to the exhaust port 20 through an exhaust pipe 22. A processing space in the chamber 10 is depressurized to a desired degree of vacuum by the exhaust device 24. An opening for loading and unloading the substrate W is formed in a side wall of the chamber 10, and the opening is opened or closed by a gate valve 26.

A first RF power supply 28 and a second RF power supply 30 are electrically connected to the base 12 through a matching unit 32 and a power feed rod 34. The first RF power supply 28 supplies RF power of a first frequency mainly contributing to plasma generation to the base 12 through the matching unit 32 and the power feed rod 34. In the present embodiment, the first frequency is a frequency of 4 MHz or higher. In the present embodiment, the first frequency is a frequency of, for example, 13 MHz. The matching unit 32 performs impedance matching between the first RF power supply 28 and a plasma load.

The second RF power supply 30 supplies high-frequency power of a second frequency, which mainly contributes to ions flowing into the substrate W on the base 12, to the base 12 through the matching unit 32 and the power feed rod 34. In the present embodiment, the second frequency is a frequency of 100 Hz or more and less than 4 MHZ. In the present embodiment, the second frequency is a frequency of, for example, 400 kHz. The matching unit 32 also performs impedance matching between the second RF power supply 30 and the plasma load.

The power feed rod 34 is a substantially cylindrical-shaped conductor. An upper end of the power feed rod 34 is connected to a central portion of a lower surface of the base 12, and a lower end thereof is connected to the matching unit 32. In addition, a substantially cylindrical-shaped cover 35 having an inner diameter that is greater than an outer diameter of the power feed rod 34 is disposed at the periphery of the power feed rod 34. An upper end of the cover 35 is connected to an opening formed in a bottom surface of the chamber 10, and a lower end thereof is connected to a case of the matching unit 32.

An edge ring 36 and an electrostatic chuck 38 are disposed on the base 12. The edge ring 36 may be referred to as a focus ring. The substrate W, which is a processing target, is disposed on an upper surface of the electrostatic chuck 38. The edge ring 36 has a substantially ring-shaped appearance, and the electrostatic chuck 38 has a substantially disc-shaped appearance. The edge ring 36 is disposed at the periphery of the electrostatic chuck 38 to surround the electrostatic chuck 38 and the substrate W on the electrostatic chuck 38. The edge ring 36 is formed of, for example, silicon (Si), silicon carbide (SiC), carbon (C), or silicon dioxide ($SiO_2$).

The electrostatic chuck 38 includes a plurality of heaters 40, a dielectric 42, and an electrode 44. The heater 40 is an example of a conductive member. The plurality of heaters 40 and the electrode 44 are enclosed in the dielectric 42. The electrode 44 is electrically connected to a direct-current (DC) power supply 45, which is disposed outside the chamber 10, through a switch 46. The electrode 44 adsorbs and holds the substrate W on the upper surface of the electrostatic chuck 38 due to a Coulomb force generated by a DC voltage applied from the DC power supply 45. In addition, a wiring between the switch 46 and the electrode 44 is sheathed with an insulator and is connected to the electrode 44 of the electrostatic chuck 38 by passing through the base 12 from below via an inside of the power feed rod 34.

Each heater 40 generates heat according to control power supplied from a heater controller 58. In the present embodiment, the control power supplied from the heater controller 58 is alternating-current (AC) power having a frequency of 50 Hz. Alternatively, the control power supplied from the heater controller 58 to each heater 40 may be AC power or DC power having a third frequency of less than 100 Hz.

Figure 2:
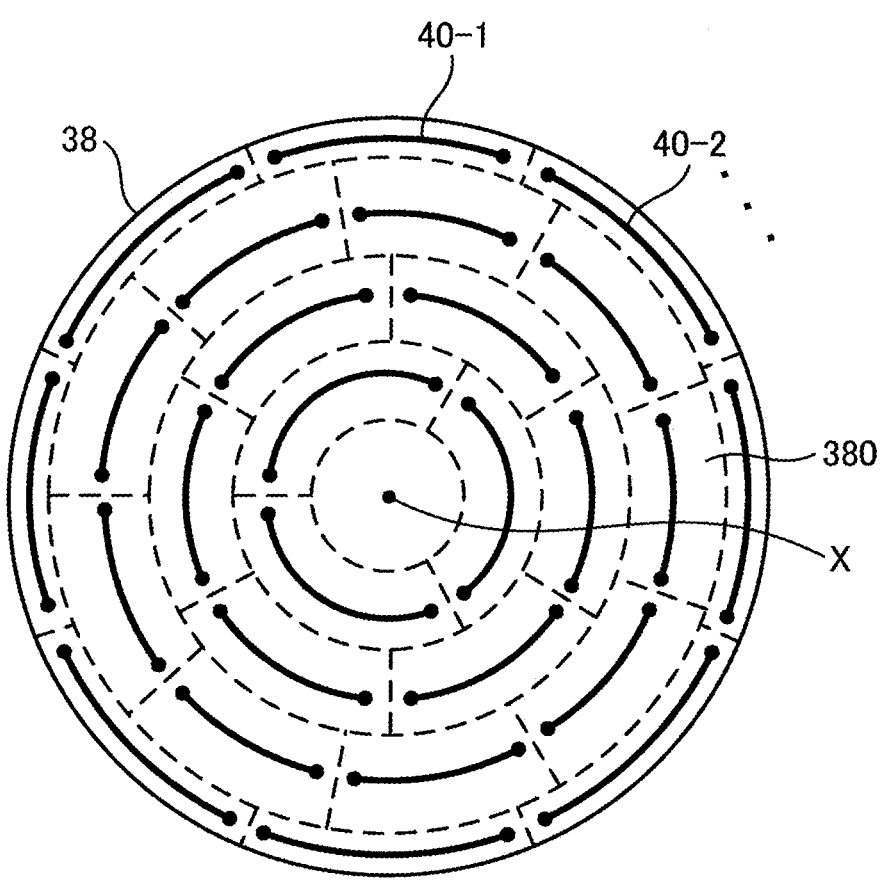
FIG. 2 is a top view illustrating an example of a distribution of regions of an electrostatic chuck.

For example, as shown in FIG. 2, the upper surface of the electrostatic chuck 38 has a plurality of regions 380. FIG. 2 is a top view illustrating an example of a distribution of regions of the electrostatic chuck 38. In the present embodiment, the plurality of regions 380 are disposed in the form of concentric circles about a central axis X of the electrostatic chuck 38. The heaters 40 (heater 40-1, heater 40-2, . . . ) are each disposed in one of the regions 380.

Referring to FIG. 1 again, the description will be made continuously. The heater controller 58 is connected to each heater 40 through a filter circuit 500 including a first filter circuit 51 and a second filter circuit 52. The heater controller 58 controls the power supplied to each heater 40 through the filter circuit 500, thereby controlling an amount of heat of each heater 40. The heater controller 58 is an example of a power supply. A detailed description of the filter circuit 500 will be made below. In the present embodiment, for example, n regions (n is an integer greater than or equal to two) are provided on the upper surface of the electrostatic chuck 38, and n heaters 40 are disposed in the electrostatic chuck 38. In the following description, when each heater 40 is distinguished, each heater 40 is denoted as a heater 40-1, a heater 40-2, . . . , or a heater 40-n.

An annular flow path 60 is provided inside the base 12, and a refrigerant from a chiller unit (not shown) is supplied to circulate in the flow path 60. The base 12 is cooled due to the refrigerant circulating in the flow path 60, and the substrate W on the electrostatic chuck 38 is cooled through the electrostatic chuck 38 provided on the base 12. In addition, a pipe 62 configured to supply a heat transfer gas such as He gas between the electrostatic chuck 38 and the substrate W is provided in the base 12 and the electrostatic chuck 38. By controlling a pressure of the heat gas supplied between the electrostatic chuck 38 and the substrate W through the pipe 62, a transfer rate of heat between the electrostatic chuck 38 and the substrate W may be controlled.

On a ceiling of the chamber 10, a shower head 64 is provided at a position facing the base 12. The shower head 64 also serves as an upper electrode, which is a counter electrode, with respect to the base 12 serving as a lower electrode. A space S between the shower head 64 and the base 12 serves as a plasma generation space. The shower head 64 includes an electrode plate 66 facing the base 12 and a support 68, which is detachable from above, configured to support the electrode plate 66. The electrode plate 66 is formed of, for example, Si or SiC. The support 68 is formed of, for example, aluminum treated with alumite.

A diffusion chamber 70 is formed in the support 68. A plurality of gas outlets 72 are formed to pass through the electrode plate 66 and the support 68 in a direction from the diffusion chamber 70 toward the base 12. A gas inlet 70a communicating with the diffusion chamber 70 is provided in an upper portion of the support 68. A process gas supply part 74 is connected to the gas inlet 70a through a pipe 76. Gas supply sources for supplying corresponding gases for each different type of gas are provided in the process gas supply part 74. A flow rate controller and a valve are connected to each gas supply source. In addition, each type of gas of which flow rate is controlled by the flow rate controller is supplied into the space S through the pipe 76.

Each component of the device main body 2 is controlled by, for example, the control device 3 including a memory, a processor, and an input/output interface. A control program and a processing recipe are stored in the memory. The processor reads the control program from the memory, executes the control program, and controls each component of the device main body 2 through the input/output interface on the basis of the recipe stored in the memory. Thus, the plasma processing device 1 performs a process, such as etching using plasma, with respect to the substrate W.

[Configuration of Filter Circuit 500]

Figure 3:
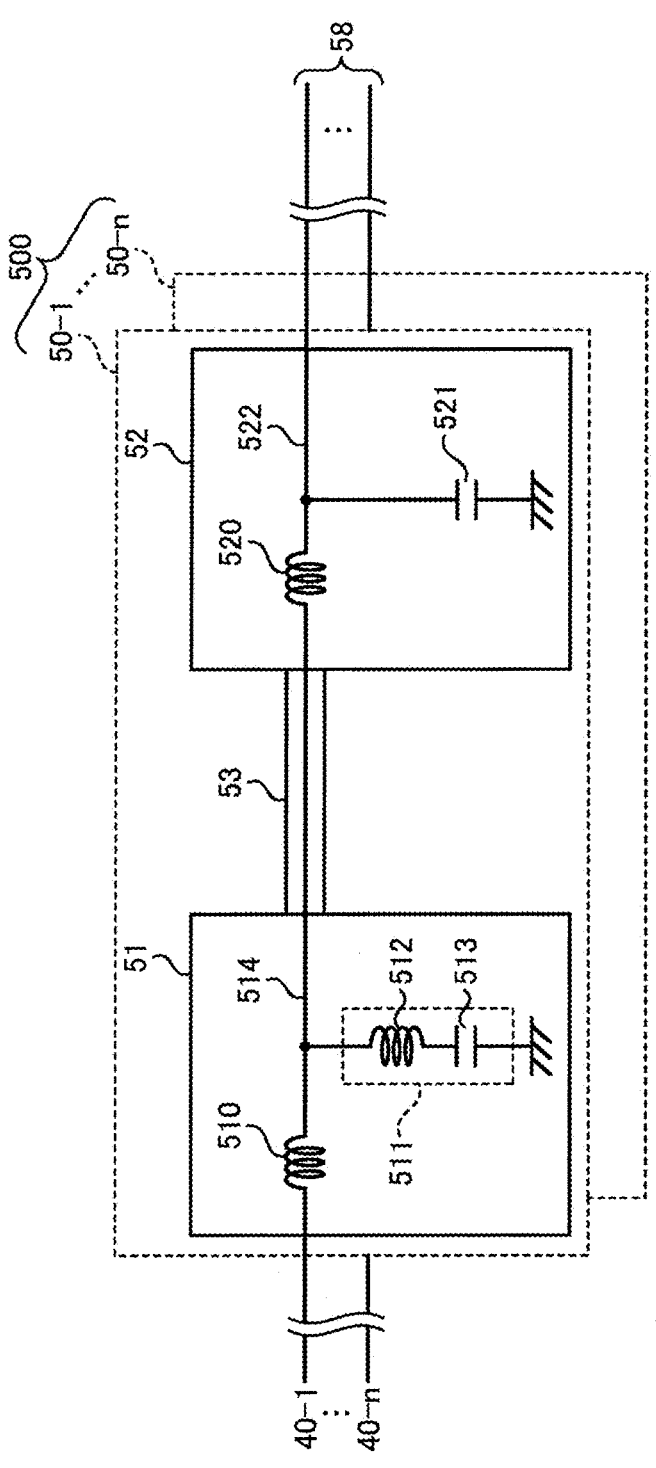
FIG. 3 is a diagram illustrating an example of a filter circuit according to one embodiment of the present disclosure.

FIG. 3 is a diagram illustrating an example of the filter circuit 500 according to one embodiment of the present disclosure. The filter circuit 500 includes a plurality of individual filter circuits 50-1 to 50-n. In addition, hereinafter, in a case in which each of the plurality of individual filter circuits 50-1 to 50-n is not distinguished and is generically referred to, each of the plurality of individual filter circuits 50-1 to 50-n is denoted as an individual filter circuit 50.

The individual filter circuit 50 includes the first filter circuit 51 for suppressing the power of the first frequency and the second filter circuit 52 for suppressing the power of the second frequency. The first filter circuit 51 is provided in a wiring between the heater 40 provided in the plasma processing device 1 and the heater controller 58 for supplying control power to the heater 40. The first filter circuit 51 is an example of a first filter. The first filter circuit 51 includes a coil 510 and a series resonant circuit 511. The coil 510 is an air-core coil having no core material (i.e., a core material is air). Thus, heat generation of the coil 510 may be suppressed. The coil 510 is an example of a first coil. In the present embodiment, inductance of the coil 510 is, for example, 50 ρH. In addition, a core material having a magnetic permeability of less than 10, such as a resin material including polytetrafluoroethylene (PTFE), may be provided in the coil 510. The core material having a magnetic permeability of less than 10 is an example of a first core material.

The series resonant circuit 511 is connected between the coil 510 and a ground. The series resonant circuit 511 includes a coil 512 and a capacitor 513. The coil 512 and the capacitor 513 are connected in series. In the series resonant circuit 511, constants of the coil 512 and the capacitor 513 are selected such that a resonance frequency of the series resonant circuit 511 is close to the first frequency (e.g., the first frequency). For example, like the coil 510, the coil 512 is an air-core coil having no core material. In the present embodiment, inductance of the coil 512 is, for example, 6 μH. In addition, a capacity of the capacitor 513 is, for example, 500 pF or less, and in the present embodiment, the capacity of the capacitor 513 is, for example, 25 pF. Thus, a resonance frequency of the series resonant circuit 511 becomes about 13 MHz.

In addition, in the first filter circuit 51, in order to suppress the power of the first frequency that is higher than the second frequency, the wiring between the heater 40 and the first filter circuit 51 may be as short as possible. Thus, it is possible to prevent the wiring from being affected by stray capacitance and inductance and suppress leakage of RF power. The capacitor 513 may be, for example, a vacuum capacitor. Thus, in addition to the fact that a dielectric constant does not depend on a temperature, since a resistance component of the capacitor 513 is extremely small, heat generation due to a current of the RF power may be suppressed to be low.

A node between the coil 510 and the series resonant circuit 511 is connected to the second filter circuit 52 via a wiring 514. The wiring 514 between the first filter circuit 51 and the second filter circuit 52 is shielded by a pipe 53 made of a metal.

The second filter circuit 52 is provided in a wiring between the first filter circuit 51 and the heater controller 58. The second filter circuit 52 is an example of a second filter. The second filter circuit 52 includes a coil 520 and a capacitor 521. The coil 520 is a core coil with a core material having a magnetic permeability of 10 or more. The coil 520 is an example of a second coil. In the present embodiment, inductance of the coil 520 is, for example, 10 mH. Examples of the core material having a magnetic permeability of 10 or more include a dust material, permalloy, cobalt-based amorphous material, and the like.

The capacitor 521 is connected between the coil 520 and the ground. In order to suppress the power of the second frequency that is lower than the first frequency, the second filter circuit 52 may be provided at a position farther away from the heater 40 than the first filter circuit 51. Therefore, the capacitor 521 may be less affected by heat from the heater 40, and a ceramic capacitor which is cheaper than a vacuum capacitor may be used. In the present embodiment, a capacity of the capacitor 521 is, for example, 2000 pF. Alternatively, when a capacitor having the same capacity as that of the capacitor 521 is provided at an output terminal of the heater controller 58 connected to the wiring 522, the capacitor 521 may not be provided in the second filter circuit 52.

A node between the coil 520 and the capacitor 521 is connected to the heater controller 58 through a wiring 522. In the present embodiment, a parasitic capacitance of each of the wiring between the heater 40 and the first filter circuit 51, the wiring 514 between the first filter circuit 51 and the second filter circuit 52, and the wiring 522 between the second filter circuit 52 and the heater controller 58 is adjusted to be 500 pF or less. For example, by inserting a spacer formed of a resin between the wiring and the ground to increase a distance therebetween, parasitic capacitance between the wiring and the ground is adjusted to be 500 pF or less.

[Parasitic Capacitance of Wiring]

Figure 4:
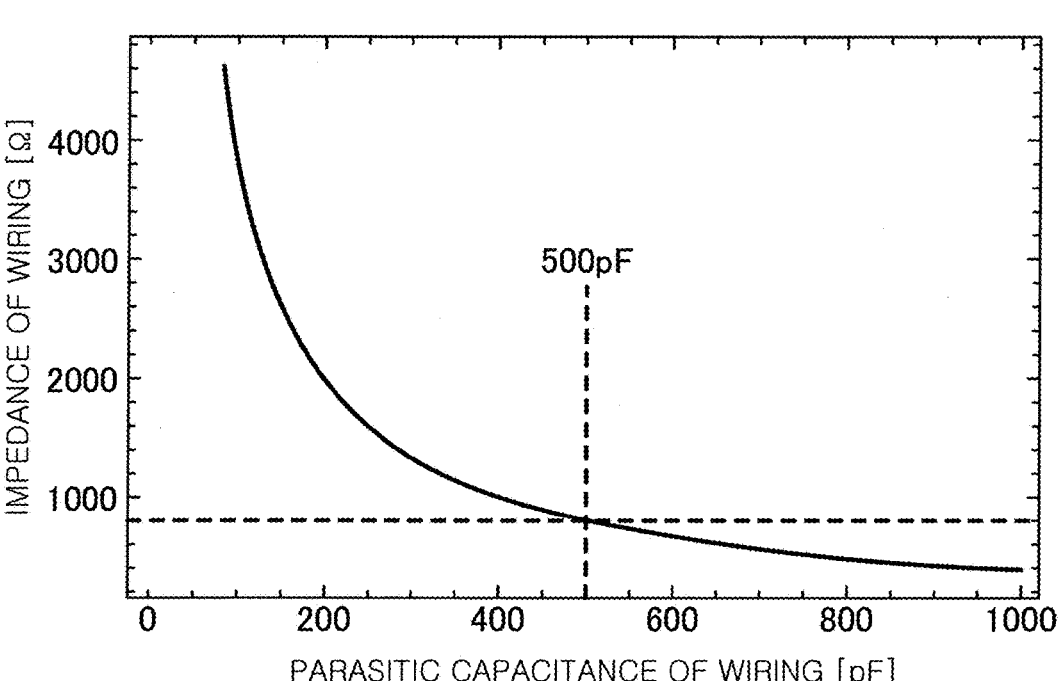
FIG. 4 is a diagram illustrating an example of impedance of a wiring with respect to a parasitic capacitance of the wiring at a frequency of 400 KHz.

FIG. 4 is a diagram illustrating an example of impedance of a wiring with respect to a parasitic capacitance of the wiring at a frequency of 400 kHz. At a frequency of 400 kHz, impedance of plasma is about 800Ω. Therefore, when the impedance of the wiring is less than 800Ω, the supplied power is introduced into the filter circuit 500 more than the plasma, and thus power loss is increased.

For example, as shown in FIG. 4, when the parasitic capacitance of the wiring is 500 pF, the impedance of the wiring is about 800Ω. In addition, for example, as shown in FIG. 4, as the parasitic capacitance of the wiring is decreased, the impedance of the wiring is increased. Therefore, in order to suppress the power loss, the parasitic capacitance of the wiring may be 500 pF or less.

[Flow of RF Current]

For example, since the coil 510 has high impedance of about 4 kΩ with respect to a frequency of 13 MHZ (the first frequency), an RF current flowing from the plasma into the first filter circuit 51 through the heater 40 is suppressed to be low. In addition, since a resonance frequency of the series resonant circuit 511 is set close to the frequency of 13 MHz (for example, the frequency of 13 MHZ), the RF current of the frequency of 13 MHz passing through the coil 510 flows to the ground through the series resonant circuit 511 and is barely introduced into the second filter circuit 52.

In addition, when a voltage of the plasma at the frequency of 13 MHz is 5 kVpp, the voltage of the plasma leaking to the first filter circuit 51 through the heater 40 is divided by the coil 510 of about 4 kΩ and the series resonant circuit 511 of less than 1Ω and is suppressed to a voltage of 100 Vpp or less. The plasma voltage suppressed to be the voltage of 100 Vpp in the first filter circuit 51 is further divided by the coil 520 and the capacitor 521 of the second filter circuit 52 and suppressed to be less than a voltage of 40 Vpp. When the plasma voltage is less than the voltage of 40 Vpp, since the plasma voltage is within a guaranteed operation range of the heater controller 58, the plasma voltage has little effect on the operation of the heater controller 58.

Figure 5:
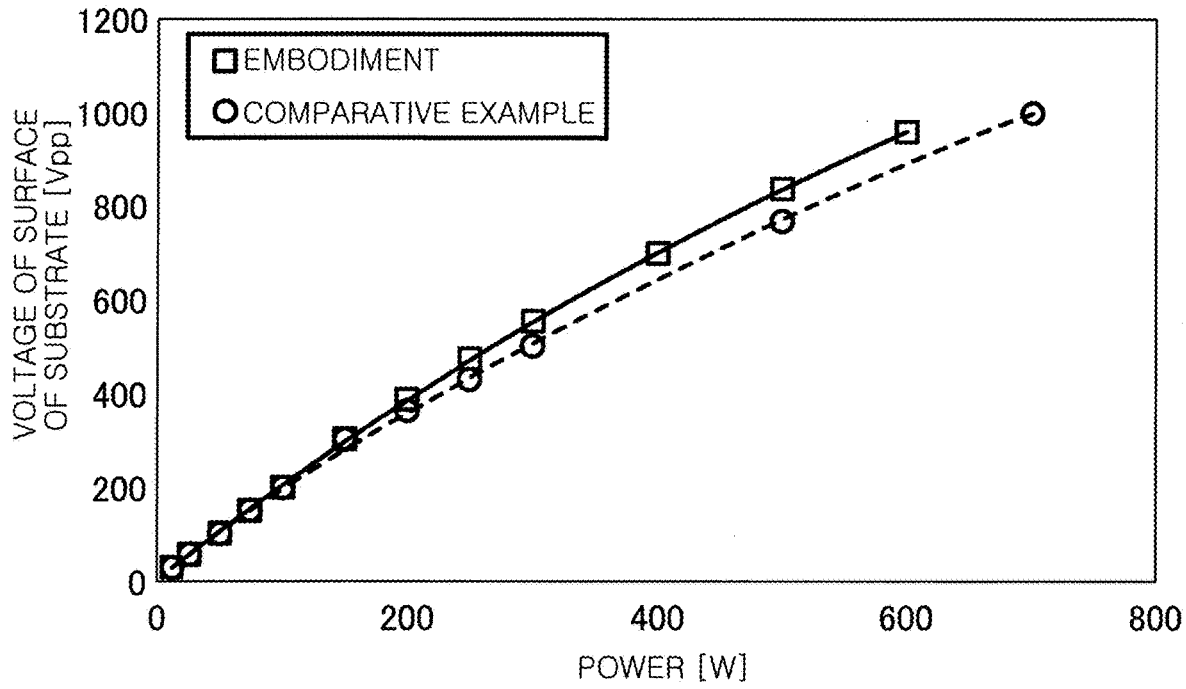
FIG. 5 is a diagram illustrating an example of a magnitude of a voltage generated on a surface of a substrate with respect to a magnitude of radio frequency (RF) power of 13 MHz.

FIG. 5 is a diagram illustrating an example of a magnitude of a voltage generated on a surface of the substrate W with respect to a magnitude of the RF power of 13 MHZ. In FIG. 5, a voltage in a case in which the filter circuit 500 is not provided is shown as Comparative Example. For example, as shown in FIG. 5, even in a case in which the filter circuit 500 of the present embodiment is used, the magnitude of the voltage generated on the surface of the substrate W is barely changed when compared to the Comparative Example in which the filter circuit 500 is not used.

Meanwhile, for example, the coil 510 has impedance of about 900Ω with respect to a frequency of 400 kHz (the second frequency). The impedance of the coil 510 is greater than or equal to the impedance of the plasma at the frequency of 400 kHz, and the impedance of the wiring from the heater 40 to the heater controller 58 is also greater than or equal to the impedance of the plasma at the frequency of 400 KHz. Therefore, the amount of RF current of the frequency of 400 kHz flowing into the filter circuit 500 is larger than the amount of RF current of the frequency of 13 MHz and also sufficiently flows to the plasma.

In addition, when a voltage of the plasma at the frequency of 400 kHz is 5 kVpp, the voltage of the plasma leaking to the first filter circuit 51 through the heater 40 is divided by the coil 510 of about 100 kΩ and the series resonant circuit 511 of about 1 kΩ and is suppressed to a voltage of 4.5 kVpp or less. The plasma voltage suppressed to be the voltage of 4.5 kVpp or less in the first filter circuit 51 is further divided by the coil 520 and the capacitor 521 of the second filter circuit 52 and suppressed to be less than a voltage of 40 Vpp. When the plasma voltage is less than the voltage of 40 Vpp, since the plasma voltage is within a guaranteed operation range of the heater controller 58, the plasma voltage has little effect on the operation of the heater controller 58.

Figure 6:
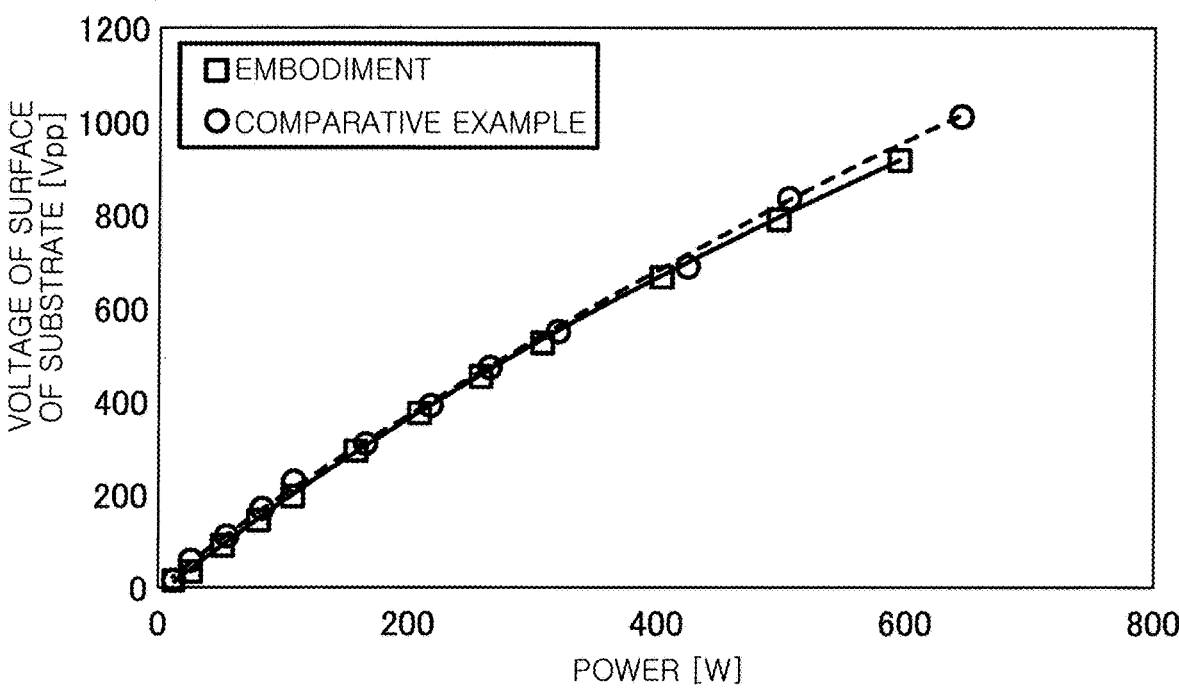
FIG. 6 is a diagram illustrating an example of a magnitude of a voltage generated on the surface of the substrate with respect to a magnitude of RF power of 400 KHz.

FIG. 6 is a diagram illustrating an example of a magnitude of a voltage generated on the surface of the substrate W with respect to a magnitude of the RF power of 400 kHz. In FIG. 6, a voltage in a case in which the filter circuit 500 being separated (that is, corresponding to a case in which the impedance of the filter circuit is infinite) is not provided is shown as Comparative Example. For example, as shown in FIG. 6, even in a case in which the filter circuit 500 of the present embodiment is used, the magnitude of the voltage generated on the surface of the substrate W is barely changed when compared to the Comparative Example in which the filter circuit 500 is not used. Therefore, when the filter circuit 500 of the present embodiment is used, performance of the plasma processing on the substrate W may be maintained, and the plasma power flowing into the heater controller 58 may be suppressed.

In the present embodiment, the power of the first frequency and the power of the second frequency are supplied to the base 12, and the control power from the heater controller 58 is supplied to the heater 40 provided in the vicinity of the base 12. Therefore, when ability of the filter circuit 500 to suppress leakage of the power of the first frequency and the power of the second frequency to the heater controller 58 is not sufficient, most of the power of the first frequency and the power of the second frequency, which are supplied to the base 12, leaks to the heater controller 58. Thus, power loss of the plasma is increased. In this regard, it is possible for the filter circuit 500 of the present embodiment to sufficiently suppress the leakage of the power of the first frequency and the power of the second frequency to the heater controller 58. Therefore, in the plasma processing device 1 having a configuration in which the power of the first frequency and the power of the second frequency are supplied to the base 12 provided in the vicinity of the heater 40, the filter circuit 500 of the present embodiment is particularly effective.

Here, three functions are required in the filter circuit 500.

(1) Due to the provision of the filter circuit 500, loss of the power supplied to the plasma is small. When the impedance of the filter circuit 500 is low, currents accompanying the power of the first frequency and the power of the second frequency, which are supplied to the base 12, flow into the plasma and the filter circuit 500 through the heater 40. This leads to the loss of the power of the first frequency and the power of the second frequency.

(2) The power of the first frequency and the power of the second frequency do not flow into the heater controller 58 connected to the filter circuit 500. A large voltage of, for example, about 5 kVpp may be applied to the base 12 to which the power of the first frequency and the power of the second frequency are supplied. On the other hand, for example, when a voltage of several tens of V or more is applied, a function failure or damage may occur in the heater controller 58. The voltage of 5 kVpp leaking from the base 12 needs to be lowered to several tens of Vpp in the heater controller 58 by the individual filter circuit 50.

(3) Like the above-described (1) and (2), it is required that the filter circuit 500 has a function of sufficiently suppressing the current and the voltage introduced from the heater 40, whereas the current supplied from the heater controller 58 is transmitted with a small loss.

The conventional filter circuit responds to only a frequency of 10 MHz or more or only a frequency of 10 MHz or less. However, the filter circuit 500 of the present embodiment may simultaneously respond to both frequencies.

Hereinbefore, one embodiment has been described. As described above, the filter circuit 500 in the present embodiment is provided in the plasma processing device 1 in which a processing is performed using plasma generated using the power of the first frequency of 4 MHz or more and the power of the second frequency of 100 Hz or more and less than 4 MHZ. The filter circuit 500 includes the first filter circuit 51 and the second filter circuit 52. The first filter circuit 51 is provided on the wiring between the heater 40 provided in the plasma processing device 1 and the heater controller 58 for supplying the power of the third frequency of less than 100 Hz or the control power, which is DC power, to the heater 40. The second filter circuit 52 is provided in the wiring between the first filter circuit 51 and the heater controller 58. In addition, the first filter circuit 51 includes the coil 510 connected to the wiring in series and having no core material or having a first core material with a relative permeability of less than 10, and the series resonant circuit 511 includes the coil 512 and the capacitor 513 which are connected in series and connected between the ground and the wiring between the heater 40 and the heater controller 58. The second filter circuit 52 includes the coil 520 connected to the wiring provided between the coil 510 and the heater controller 58 in series and having a second core material with a relative permeability of 10 or more. With the above configuration, the filter circuit 500 in the present embodiment may suppress leakage of the power, which is supplied to the plasma, to the heater controller 58 and suppress power loss of the plasma.

In addition, in the present embodiment, the capacitor 513 included in the series resonant circuit 511 may be a vacuum capacitor. Thus, a variation in capacity of the series resonant circuit 511 due to heat generated from the heater 40 may be suppressed.

In addition, in the present embodiment, the second core material is a dust material, a permalloy, or a cobalt-based amorphous material. Thus, the power of the second frequency flowing into the heater controller 58 from the heater 40 may be reduced.

In addition, in the present embodiment, the second filter circuit 52 may include a capacitor provided between the ground and the wiring 522 between the coil 520 and the heater controller 58. Thus, the power of the second frequency flowing into the heater controller 58 from the heater 40 may be reduced.

In the present embodiment, the first frequency is, for example, 13 MHz, the second frequency is, for example, 400 kHz, and the third frequency is, for example, 50 Hz. In addition, in the present embodiment, a stray capacitance of each of the wiring between the heater 40 and the first filter circuit 51, the wiring between the first filter circuit 51 and the second filter circuit 52, and the wiring between the second filter circuit 52 and the heater controller 58 may be, for example, 500 pF or less. Accordingly, a loss of the power supplied to the plasma may be reduced.

[Others]

In addition, the technology disclosed herein is not limited to the above-described embodiments, and many modifications are possible within the gist of the present disclosure.

For example, in the above-described embodiments, the plasma processing is performed using the RF power of the frequency of 13 MHz and the RF power of the frequency of 400 kHz, but the disclosed technology is not limited thereto. As another embodiment, a plasma processing may be performed using two RF powers of different frequencies of 4 MHz or more and an RF power of a frequency of less than 4 MHZ. For example, the plasma processing may be performed using RF power of a frequency of 40 MHZ, RF power of a frequency of 13 MHZ, and RF power of a frequency of 400 KHz.

Figure 9:
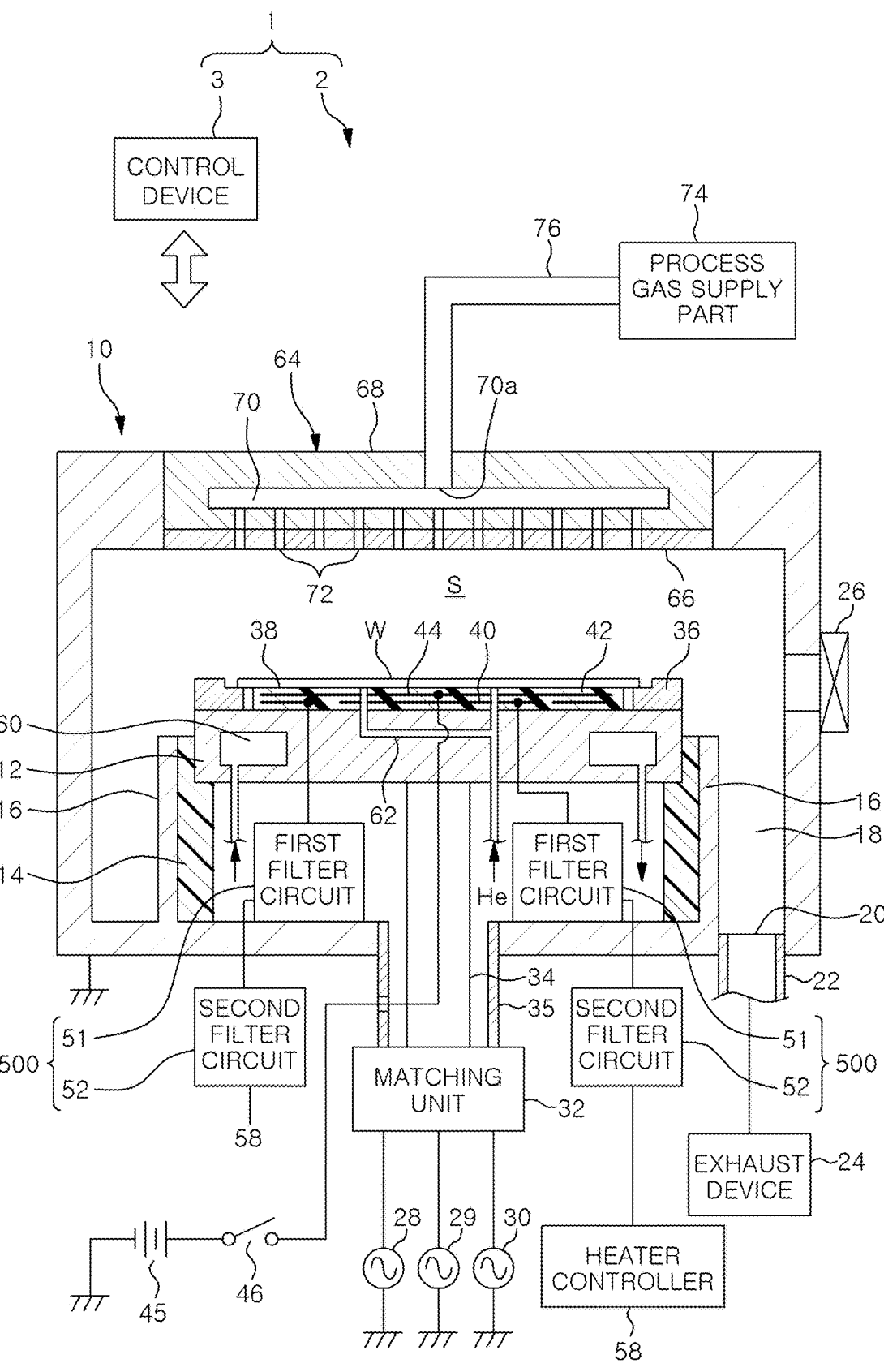
FIG. 9 is a schematic cross-sectional view illustrating another example of the plasma processing device.

Such a plasma processing is performed, for example, by a plasma processing device 1 as shown in FIG. 9. FIG. 9 is a schematic cross-sectional view illustrating another example of the plasma processing device 1. In addition, in FIG. 9, except for a description below, a component to which the same reference numeral as in FIG. 1 is given is the same as that of the component described in FIG. 1, and thus a description thereof will be omitted herein.

A first RF power supply 28, a second RF power supply 30, and a third RF power supply 29 are electrically connected to a base 12 through a matching unit 32 and a power feed rod 34. In the example of FIG. 9, the first RF power supply 28 and the third RF power supply 29 supply RF power of a first frequency mainly contributing to plasma generation to the base 12 through the matching unit 32 and the power feed rod 34. In the example of FIG. 9, the first frequency is a frequency of 4 MHZ or higher. In the example of FIG. 9, the power of the first frequency includes power of a plurality of different frequencies. In the example of FIG. 9, the power of a plurality of different frequencies includes, for example, power of a frequency of 13 MHz and power of a frequency of 40 MHz. The first RF power supply 28 supplies, for example, RF power of the frequency of 13 MHz to the base 12 through the matching unit 32 and the power feed rod 34. In addition, the third RF power supply 29 supplies, for example, RF power of the frequency of 40 MHz to the base 12 through the matching unit 32 and the power feed rod 34. The matching unit 32 performs impedance matching between a plasma load and the first RF power supply 28 and the third RF power supply 2.

The second RF power supply 30 supplies high-frequency power of a second frequency, which mainly contributes to ions flowing into the substrate W on the base 12, to the base 12 through the matching unit 32 and the power feed rod 34. In the example of FIG. 9, the second frequency is a frequency of 100 Hz or more and less than 4 MHz. In the example of FIG. 9, the second frequency is a frequency of, for example, 400 KHz. The matching unit 32 also performs impedance matching between the second RF power supply 30 and the plasma load.

The power feed rod 34 is a substantially cylindrical-shaped conductor. An upper end of the power feed rod 34 is connected to a central portion of a lower surface of the base 12, and a lower end thereof is connected to the matching unit 32. In addition, a substantially cylindrical-shaped cover 35 having an inner diameter that is greater than an outer diameter of the power feed rod 34 is disposed at the periphery of the power feed rod 34. An upper end of the cover 35 is connected to an opening formed on a bottom surface of the chamber 10, and a lower end thereof is connected to a case of the matching unit 32.

Figure 10:
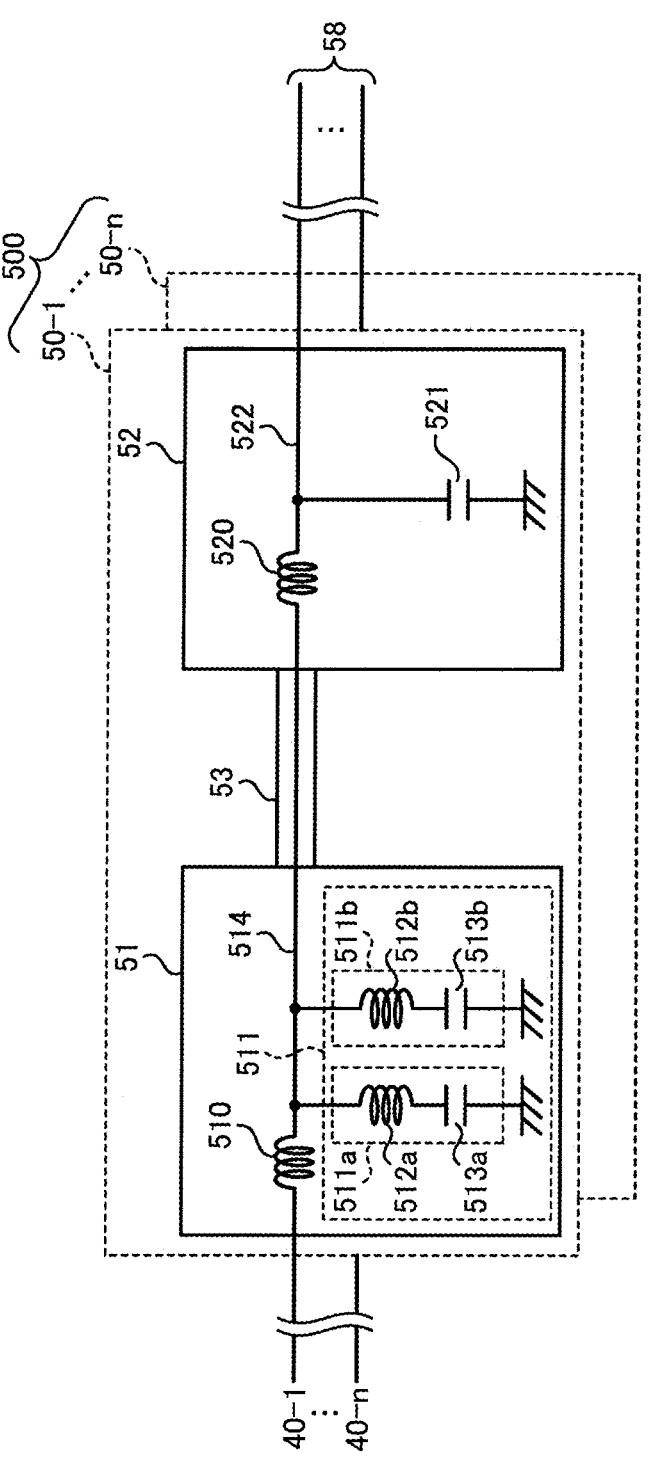
FIG. 10 is a diagram illustrating an example of a filter circuit included in the plasma processing device illustrated in FIG. 9.

FIG. 10 is a diagram illustrating an example of a filter circuit 500 included in the plasma processing device 1 illustrated in FIG. 9. The filter circuit 500 includes a plurality of individual filter circuits 50-1 to 50-*n*. In addition, in FIG. 10, except for a description below, a component to which the same reference numeral as in FIG. 3 is given is the same as that of the component described in FIG. 3, and thus a description thereof will be omitted herein.

The individual filter circuit 50 includes the first filter circuit 51 for suppressing the power of the first frequency and the second filter circuit 52 for suppressing the power of the second frequency. The first filter circuit 51 includes a coil 510 and a series resonant circuit 511. The series resonant circuit 511 includes a series resonant circuit 511*a* and a series resonant circuit 511*b*. The series resonant circuit 511*a* and the series resonant circuit 511*b* are examples of individual series resonant circuits.

The series resonant circuit 511*a* is connected between the coil 510 and a ground. The series resonant circuit 511*a* includes a coil 512*a* and a capacitor 513*a*. The coil 512*a* and the capacitor 513a are connected in series. In the series resonant circuit 511a, constants of the coil 512a and the capacitor 513a are selected such that a resonance frequency of the series resonant circuit 511a becomes, for example, a frequency of about 13 MHz (e.g., a frequency of 13 MHZ). For example, like the coil 510, the coil 512a is an air-core coil having no core material. In the example of FIG. 10, inductance of the coil 512a is, for example, 6 μH. In addition, a capacity of the capacitor 513a is, for example, 500 pF or less, and in the example of FIG. 10, the capacity of the capacitor 513a is, for example, 25 pF. Thus, a resonance frequency of the series resonant circuit 511a becomes about 13 MHz. The RF power of a frequency of, for example, 13 MHz is suppressed by the coil 510 and the series resonant circuit 511a.

The series resonant circuit 511b is connected between the coil 510 and the ground. The series resonant circuit 511b includes a coil 512b and a capacitor 513b. The coil 512b and the capacitor 513b are connected in series. In the series resonant circuit 511b, constants of the coil 512b and the capacitor 513b are selected such that a resonance frequency of the series resonant circuit 511b becomes, for example, a frequency of near 40 MHz (e.g., a frequency of 40 MHz). For example, like the coil 510, the coil 512b is an air-core coil having no core material. In the example of FIG. 10, inductance of the coil 512b is, for example, 2 ρH. In addition, a capacity of the capacitor 513b is, for example, 500 pF or less, and in the example of FIG. 10, the capacity of the capacitor 513a is, for example, 8 pF. Thus, a resonance frequency of the series resonant circuit 511b becomes about 40 MHz. The RF power of a frequency of, for example, 40 MHZ is suppressed by the coil 510 and the series resonant circuit 511b.

In addition, in the example of FIG. 9, the power of the first frequency of 4 MHz or higher includes the power of two different frequencies of, for example, 13 MHz and 40 MHz, but the disclosed technology is not limited thereto. As another example, the power of the first frequency may include power of three or more different frequencies. In that case, one series resonant circuit having a frequency in the vicinity of the frequency of the power as a resonant frequency is provided for the power of each frequency.

Figure 7:
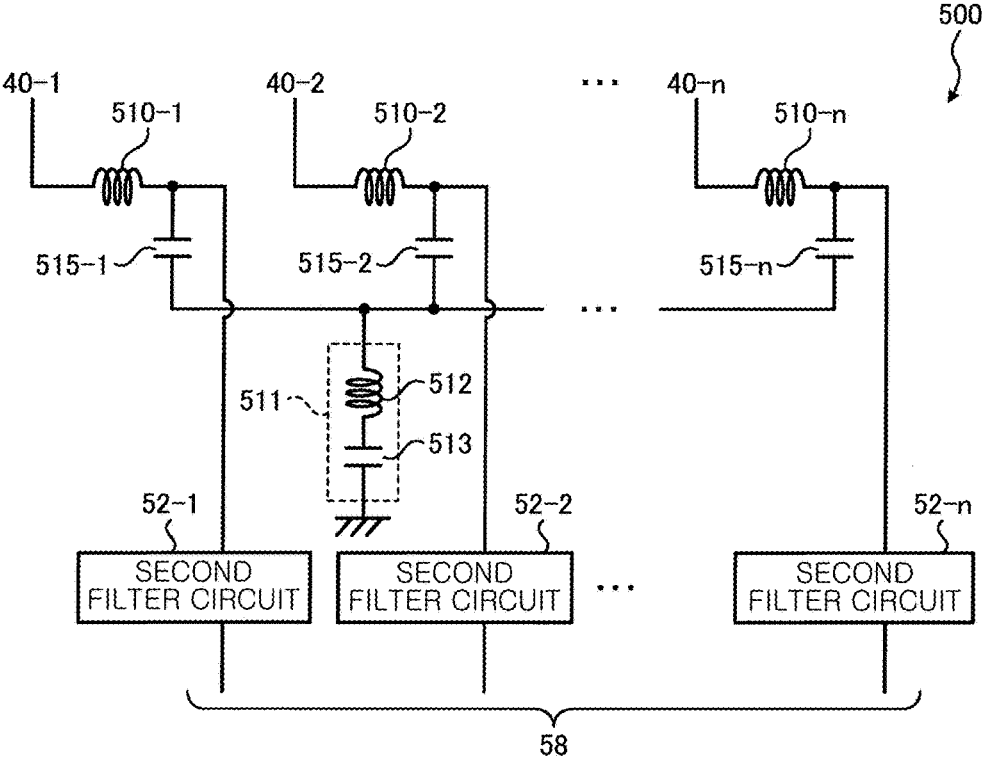
FIG. 7 is a diagram illustrating another example of the filter circuit.

In addition, in the above-described embodiments, one series resonant circuit 511 is provided for each heater 40, but the disclosed technology is not limited thereto. For example, as shown in FIG. 7, one series resonant circuit 511 may be provided in common for the plurality of heaters 40. FIG. 7 is a diagram illustrating another example of the filter circuit 500.

The filter circuit 500 illustrated in FIG. 7 includes a plurality of coils 510-1 to 510-n, a plurality of capacitors 515-1 to 515-n, a series resonant circuit 511, and a plurality of second filter circuits 52-1 to 52-n. Hereinafter, when the plurality of coils 510-1 to 510-n are collectively referred to without being distinguished, each of the plurality of coils 510-1 to 510-n is denoted as a coil 510, and when the plurality of capacitors 515-1 to 515-n are collectively referred to without being distinguished, each of the plurality of capacitors 515-1 to 515-n is denoted as a capacitor 515. In addition, hereinafter, when the plurality of second filter circuits 52-1 to 52-n are collectively referred to without being distinguished, each of the plurality of second filter circuits 52-1 to 52-n is denoted as a second filter circuit 52.

The coil 510, the capacitor 515, and the second filter circuit 52 are each provided with respect to one heater 40. One end of the coil 510 is connected to a corresponding heater 40, and the other end thereof is connected to the series resonant circuit 511 through a corresponding capacitor 515. In addition, the other end of the coil 510 is connected to a heater controller 58 through a corresponding second filter circuit 52. The capacitor 515 provided to correspond to each heater 40 is provided to suppress control power of a frequency of less than 100 Hz, which is supplied from the heater controller 58 to each heater 40, from flowing into another heater 40. Thus, the control power of different magnitudes may be independently supplied to each heater 40. In the present embodiment, a capacity of the capacitor 515 is, for example, 2000 pF. Therefore, for example, with respect to control power of a frequency of 50 Hz, an impedance of the capacitor 515 becomes approximately 1.6 MΩ. Accordingly, the capacitor 515 may suppress a transfer of the control power through the capacitor 515.

In the example of FIG. 7, one coil 510 and one series resonant circuit 511 provided in common correspond to one first filter circuit 51 in the above-described embodiments. In addition, in the example of FIG. 7, one series resonant circuit 511 is provided in common with respect to the plurality of heaters 40. However, when one series resonant circuit 511 is provided in common with respect to two or more heaters 40, a plurality of series resonant circuits 511 may be provided. Thus, a current flowing into one series resonant circuit 511 may be distributed, and heat generation of the series resonant circuit 511 may be suppressed.

Here, in the above-described embodiments, one series resonant circuit 511 is provided with respect to each heater 40. Therefore, there is a case in which the sum of the parasitic capacitances of the wirings of the individual filter circuits 50 may exceed a capacitance of 500 pF with respect to the plasma generated in the chamber 10. In addition, when the number of heaters 40 is increased, it becomes more difficult to suppress the sum of the parasitic capacitances of the wirings of the individual filter circuits 50 to be a capacitance of 500 pF or less. Thus, power loss of the plasma may be increased.

With respect to the above description, in the filter circuit 500 illustrated in FIG. 7, the series resonant circuit 511 is provided in common with respect to the plurality of heaters 40. Accordingly, it becomes easy to suppress the sum of the parasitic capacitances of the wirings of the individual filter circuits 50 to be a capacitance of 500 pF or less with respect to the plasma.

Figure 8:
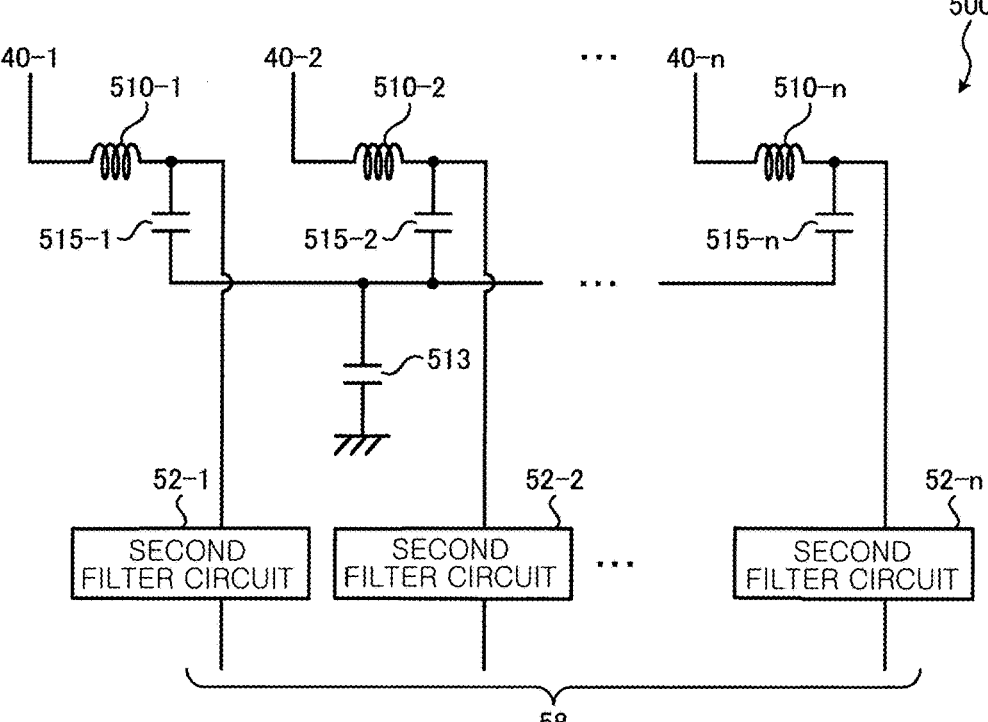
FIG. 8 is a diagram illustrating another example of the filter circuit.

In addition, in the example of FIG. 7, one series resonant circuit 511 is provided in common with respect to the plurality of heaters 40. As another example, for example, as shown in FIG. 8, one capacitor 513 may be provided in common with respect to the plurality of heaters 40. FIG. 8 is a diagram illustrating another example of the filter circuit 500. Even in such a configuration, the filter circuit 500 in the present embodiment may suppress leakage of the power, which is supplied to the plasma, to the heater controller 58 and suppress power loss of the plasma.

Figure 11:
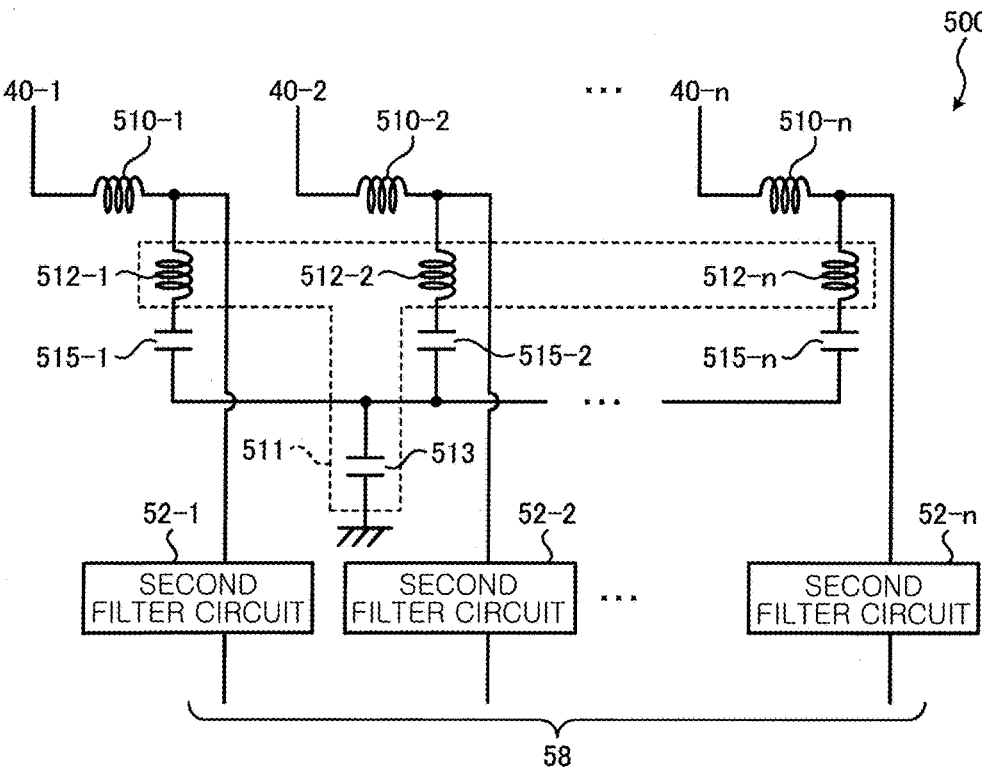
FIG. 11 is a diagram illustrating another example of the filter circuit.

In addition, in the example of FIG. 7, one coil 512 is provided in the series resonant circuit 511 provided in common with respect to the plurality of heaters 40, but the disclosed technology is not limited thereto. FIG. 11 is a diagram illustrating another example of the filter circuit 500.

In the filter circuit 500 illustrated in FIG. 11, a plurality of coils 512-1 to 512-n and a capacitor 513 are provided in the series resonant circuit 511. Hereinafter, when the plurality of coils 512-1 to 512-n is collectively referred to without being distinguished, each of the plurality of coils 512-1 to 512-n is denoted as a coil 512. In the example of FIG. 11, one coil 512 is provided with respect to one heater 40 and one coil 510. Each coil 512 is connected to the coil 510 in series. In addition, each coil 512 is connected to the capacitor 513 of the series resonant circuit 511 through the capacitor 515 provided with respect to one heater 40. In the example of FIG. 11, since one coil 512 of the series resonant circuit 511 is provided with respect to each heater 40, a current flowing into the coil of the series resonant circuit 511 may be distributed, and heat generation of the coil 512 included in the series resonant circuit 511 may be suppressed.

In the example of FIG. 11, one coil 510, one coil 512 included in the series resonant circuit 511, and the capacitor 513 in the series resonant circuit 511 correspond to one first filter circuit 51 in the above-described embodiments. In addition, in the example of FIG. 11, one capacitor 513 of the series resonant circuit 511 is provided in common with respect to the plurality of heaters 40. However, when one capacitor of the series resonant circuit 511 is provided in common with respect to two or more heaters 40, two or more capacitors 513 may be provided in the series resonant circuit 511.

Figure 12:
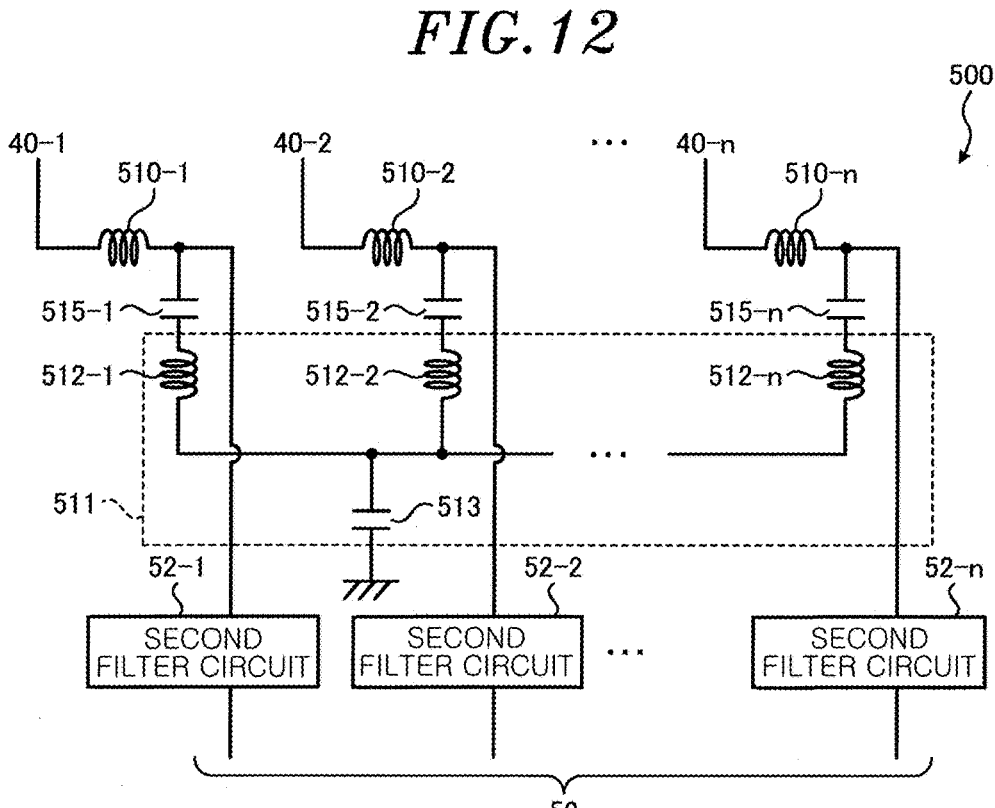
FIG. 12 is a diagram illustrating another example of the filter circuit.

In addition, in the example of FIG. 11, since the capacitor 515 is provided between the coil 512 and the capacitor 513 of the series resonant circuit 511, there is a case in which it is difficult to adjust the resonance frequency of the series resonant circuit 511. Therefore, for example, as shown in FIG. 12, one end of each coil 512 may be connected to the coil 510 through the capacitor 515. The other end of each coil 512 is connected to the capacitor 513. As shown in FIG. 11, since the plurality of coils 512 and the capacitor 513, which are included in the series resonant circuit 511, are connected without passing through other circuits, the resonance frequency of the series resonant circuit 511 may be easily adjusted.

Figure 13:
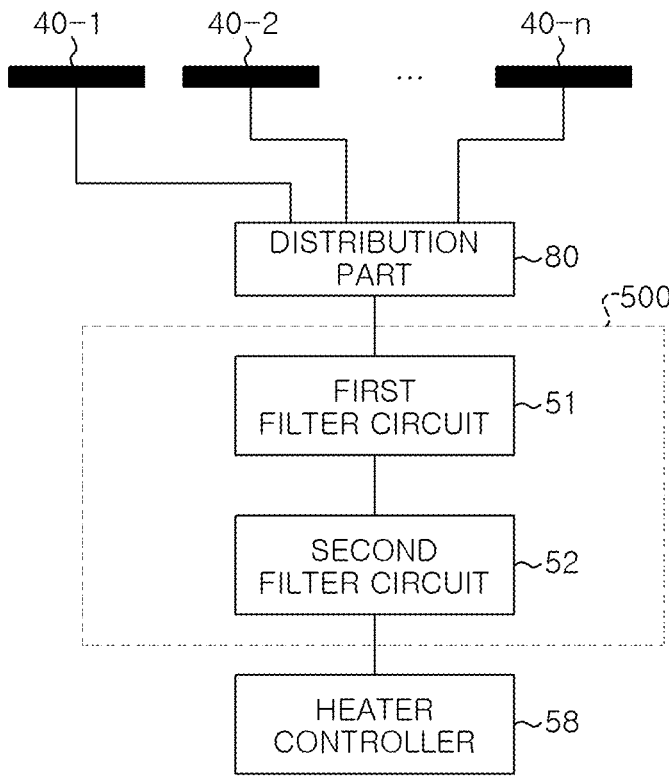
FIG. 13 is a diagram illustrating another example of the filter circuit.

In addition, for example, as shown in FIG. 13, a distribution part 80 may be installed between the plurality of heaters 40-1 to 40-*n* and the filter circuit 500. The distribution part 80 individually supplies control power to each of the plurality of heaters 40-1 to 40-*n*. Accordingly, the filter circuit 500 may be miniaturized and the plasma processing device 1 may be miniaturized.

In addition, in the above-described embodiments, the control power from the heater controller 58, which is an example of the power supply, is supplied to the heater 40, which is an example of the conductive member, but the conductive member to which the control power is supplied is not limited thereto. For example, a power controller may supply power to a conductive member in addition to the heater 40 provided in the plasma processing device 1. In addition to the heater 40, examples of the conductive member include the base 12 to which the power of the first frequency and the power of the second frequency are supplied, the shower head 64 for supplying gas into the plasma processing device 1, and the edge ring 36.

In addition, in the above-described embodiments, an example of the plasma processing device 1 using capacitively coupled plasma (CCP) as a plasma source has been described, but the plasma source is not limited thereto. For example, an example of the plasma source in addition to the CCP includes inductively coupled plasma (ICP).

In addition, in the above-described embodiments, the power of the first frequency and the power of the second frequency are supplied to the base 12, but the disclosed technology is not limited thereto. For example, at least one of the power of the first frequency and the power of the second frequency may be supplied to the shower head 64.

In addition, in the above-described embodiments, an example of the plasma processing device 1 for processing the substrate W with the plasma generated using two types of the power of the first frequency of 4 MHz or higher and the power of the second frequency of 100 Hz or higher and less than 4 MHz has been described. However, the disclosed technology is not limited thereto. For example, as another example, the disclosed technology may be applied to the plasma processing device 1 for processing the substrate W with plasma generated using power of one or a plurality of first frequencies and power of one or a plurality of second frequencies. For example, the disclosed technology may be applied to the plasma processing device 1 for processing the substrate W with plasma generated using power of the first frequency of 40 MHz and power of the second frequency of 400 kHz. In this case, in each individual filter circuit 50, a series resonant circuit 511-1 set at a resonance frequency of 40 MHz and a series resonant circuit 511-2 set at a resonance frequency of 13 MHz are provided.

In addition, in the above-described embodiments, the series resonant circuit 511 included in the first filter circuit 51 is disposed in the chamber 10. However, as another example, the series resonant circuit 511 may be provided outside the chamber 10, for example, at the second filter circuit 52 side through the pipe 53. Alternatively, for example, the series resonant circuit 511 may be provided outside the chamber 10 through the pipe 53 or may be connected to the second filter circuit 52 through the pipe 53.

In addition, it should be construed that the disclosed embodiments are illustrative and not restrictive in all aspects. Actually, the disclosed embodiments can be implemented in various forms. In addition, the above embodiments can be omitted, substituted, and alternated in various forms without deviating from the scope and gist of the appended claims.

The invention claimed is:

1. A filter circuit provided in a plasma processing device for processing a substrate using plasma generated using power of a first frequency of 4 MHz or more and power of a second frequency of 100 Hz or more and less than 4 MHz, the filter circuit comprising:

a first filter provided in a wiring between a conductive member provided in the plasma processing device and a power supply configured to supply power of a third frequency of less than 100 Hz or control power which is direct-current (DC) power, to the conductive member; and a second filter provided in a wiring between the first filter and the power supply, wherein the first filter includes:

a first coil which is connected to the wiring in series and which has no core material or has a first core material with a relative permeability of less than 10, and wherein the second filter includes a second coil which is connected to the wiring provided between the first coil and the power supply in series and which has a second core material with a relative permeability of 10 or more.

2. The filter circuit of claim 1, wherein the first filter further includes a first capacitor which is connected between the wiring and a ground.

3. The filter circuit of claim 1, wherein the second core material includes a dust material, a permalloy, or a cobalt-based amorphous material.

4. The filter circuit of claim 1, wherein the second filter includes a second capacitor provided between the ground and the wiring between the second coil and the power supply.

5. The filter circuit of claim 4, wherein a capacitance of the second capacitor is greater than a capacitance of the first capacitor.

6. The filter circuit of claim 1, wherein the conductive member includes a heater configured to control a temperature of the substrate.

7. The filter circuit of claim 1, wherein a stray capacitance of each of a wiring between the conductive member and the first filter, a wiring between the first filter and the second filter, and a wiring between the second filter and the power supply is less than or equal to 500 pF.

8. The filter circuit of claim 1, wherein:

the conductive member is provided as a plurality of conductive members in the plasma processing device;

the first filter includes a plurality of first coils identical to the first coil and one or more series resonant circuits identical to the series resonant circuit;

the first coils are respectively provided with respect to the conductive members; and one of the series resonant circuits is provided in common with respect to two or more of the first coils.

9. The filter circuit of claim 1, wherein:

the conductive member is provided as a plurality of conductive members in the plasma processing device;

the first filter includes a plurality of first coils which are identical to the first coil and which are respectively provided with respect to the conductive members;

the series resonant circuit includes a plurality of coils, which are respectively provided with respect to the conductive members, and one or more capacitors;

the coils included in the series resonant circuit are respectively connected to the first coils in series; and one capacitor included in the series resonant circuit is provided in common with respect to one or more of the first coils and one or more of the coils included in the series resonant circuit.

10. The filter circuit of claim 1, wherein the power of the first frequency includes power of a plurality of different frequencies, and the series resonant circuit includes a plurality of individual series resonant circuits, each having a frequency of each power as each resonant frequency.

* * * * *